(12) United States Patent
Fukumoto

(10) Patent No.: US 6,743,723 B2
(45) Date of Patent: Jun. 1, 2004

(54) METHOD FOR FABRICATING SEMICONDUCTOR DEVICE

(75) Inventor: Yoshihiko Fukumoto, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 267 days.

(21) Appl. No.: 09/429,530

(22) Filed: Oct. 28, 1999

(65) Prior Publication Data

US 2002/0004302 A1 Jan. 10, 2002

Related U.S. Application Data

(63) Continuation-in-part of application No. 08/979,957, filed on Nov. 26, 1997, now abandoned, and a continuation-in-part of application No. 08/714,437, filed on Sep. 16, 1996, now Pat. No. 6,307,264.

(30) Foreign Application Priority Data

Sep. 14, 1995 (JP) .......................... 07-236865
Sep. 12, 1996 (JP) .......................... 08-241939
Nov. 29, 1996 (JP) .......................... 08-319568

(51) Int. Cl.$^7$ ............................ H01L 21/302
(52) U.S. Cl. ................. 438/691; 438/692; 438/693; 134/1.1
(58) Field of Search ................. 438/690, 691, 438/692, 693; 134/1.1, 1.2

(56) References Cited

U.S. PATENT DOCUMENTS

| | | | | |
|---|---|---|---|---|
| 4,544,446 A | * | 10/1985 | Cady ............................ 156/639 |
| 5,262,354 A | | 11/1993 | Cote et al. .................... 437/195 |
| 5,368,054 A | * | 11/1994 | Koretsky et al. ............ 134/153 |
| 5,426,523 A | | 6/1995 | Shimada ....................... 359/54 |
| 5,595,412 A | * | 1/1997 | Kudo et al. ................. 294/87.1 |
| 5,596,230 A | | 1/1997 | Hong ........................... 257/755 |
| 5,602,423 A | | 2/1997 | Jain ............................. 257/752 |
| 5,607,718 A | * | 3/1997 | Sasaki et al. ................. 427/97 |
| 5,665,496 A | | 9/1997 | Omika et al. .................. 430/7 |
| 5,691,794 A | | 11/1997 | Hoshi et al. ................. 349/158 |
| 5,711,646 A | | 1/1998 | Ueda et al. .................. 414/225 |
| 5,767,827 A | | 6/1998 | Kobayashi et al. ........... 345/87 |
| 5,853,522 A | | 12/1998 | Krusell et al. ............... 156/345 |
| 5,868,866 A | * | 2/1999 | Maekawa et al. ............. 134/34 |
| 5,933,204 A | | 8/1999 | Fukumoto .................... 349/43 |
| 6,057,248 A | * | 5/2000 | Wu et al. ..................... 438/745 |
| 6,123,088 A | * | 9/2000 | Ho .............................. 134/1.3 |
| 6,274,059 B1 | | 8/2001 | Krusell et al. ................. 216/88 |

FOREIGN PATENT DOCUMENTS

| | | |
|---|---|---|
| DE | 195 25 521 A1 | 3/1996 |
| DE | 196 25 521 | 3/1998 |
| EP | 0 390 134 | 10/1990 |
| EP | 0 692 318 | 1/1996 |
| EP | 0 768 710 | 4/1997 |
| JP | 1-140727 | 6/1989 |
| JP | 5-289925 | 1/1990 |
| JP | 5-134398 | 5/1993 |
| JP | 5-251412 | 9/1993 |
| JP | 7-74132 | 3/1995 |
| JP | 8-187475 | 7/1996 |
| JP | 8-238463 | 9/1996 |
| KR | 95-9958 | 4/1995 |
| KR | 97-72138 | 11/1997 |

OTHER PUBLICATIONS

H. Aoki et al., "Novel Electroysis . . . Processes", 1994 Symposium on VLSI Tech. Dig. Tech. Papers, Jun. 7–9, 1994, pp. 79–80.

* cited by examiner

*Primary Examiner*—Lan Vinh
(74) *Attorney, Agent, or Firm*—Fitzpatrick, Cella, Harper & Scinto

(57) ABSTRACT

A fabrication method of semiconductor device comprising a step of forming an electroconductive material film on a substrate, a step of polishing the electroconductive material film, and a step of washing a polished surface of the electroconductive material film, wherein the washing step is a step of carrying out ultrasonic washing with a washing solution to which an ultrasonic wave is applied, prior to physical washing.

1 Claim, 15 Drawing Sheets

FIG. 10

DATE: 96/07/30 18:22          LENS NO. :5
                    22

LEVEL: 0.23:L1   X= 96120   Y= 67384

2000 rpm, 30 mm

US 6,743,723 B2

METHOD FOR FABRICATING SEMICONDUCTOR DEVICE

This application is a continuation-in-part of application Ser. No. 08/979,957, filed Nov. 26, 1997, now abandoned and application Ser. No. 08/714,437, filed Sep. 16, 1996 now U.S. Pat. No. 6,307,264, the disclosures of which are incorporated by reference.

BACKGROUND OF THE INVENTION

1. Field of the Invention

The present invention relates to a method for fabricating a semiconductor device and, more particularly, to a method for fabricating a semiconductor device, characterized by a washing step thereof.

2. Related Background Art

Degrees of integration of LSI including DRAM and MPU are increasing year after year, and with the increase of integration the design rules are decreasing and wiring tends to be formed in a multilayered structure. With progress in the development of multilayer interconnection structure, the CMP (Chemical Mechanical Polishing) technology to flatten a layer insulation film was introduced in fabrication of 0.35-$\mu$m logic LSI in order to ensure the focus margin of exposure system. The chemical mechanical polishing (CMP) is a polishing method for carrying out polishing by making use of the chemical etching action of a chemical component contained in an abrasive and the mechanical polishing action which the abrasive originally has. The CMP techniques used in fabrication processes of LSI include planarization CMP and recess CMP; the planarization CMP is a technique for flattening device steps by polishing an insulation film of BPSG, $SiO_2$, or the like deposited on the steps of devices such as transistors, wires, and so on; the recess CMP is a technique for forming an isolated buried element, a trench capacitor, a contact plug, or damascene wiring by burying an insulation film of $SiO_2$ or the like or a metal film of poly-Si, Al, Cu, W, or the like in a hole or a trench formed on a device and removing the film deposited on portions except for the hole or trench portion by polishing. Either of the techniques has the capability of realizing global flatness, when compared with the SOG planarization technology and etch back planarization technology used heretofore.

Under such circumstances, it is considered that the layer-insulation-film-flattening CMP technology and the conventional wiring forming technology are adaptable to fabrication of LSI of 0.25-$\mu$m and larger rules, but for 0.18-$\mu$m and smaller rules, the buried wiring structure by dual damascene using the metal CMP technology will become essential for formation of multilayered wiring, because of factors such as the limit of etching technology of wiring material and guarantee of electromigration resistance.

A buried wiring forming method by dual damascene using the metal CMP will be described below referring to FIG. 26 to FIG. 32.

In FIG. 26, reference numeral 1 designates a p-type semiconductor substrate, 2 n-type wells, 3 high-concentration p$^+$-type source electrodes, 4 high-concentration p$^+$-type drain electrodes, and 5 gate electrodes, and low-concentration p$^-$-type electric field relaxing regions 3', 4' for increasing the withstand voltage of transistor are provided around the source electrodes 3 and drain electrodes 4. Numeral 6 denotes selective oxide regions for element isolation.

Then, as shown in FIG. 27, NSG (non-doped glass) 7 is deposited by CVD or TEOS and thereafter this NSG 7 is polished and flattened by CMP. The CMP employed herein is polishing using an abrasive cloth, which is a lamination of a foam cloth such as IC-1000 generally used for CMP of layer insulation film and a cloth of nonwoven fabric type, and a silica-based slurry such as SC-1 using fumed silica. Then p-SiN (silicon nitride film formed by the plasma enhanced CVD process) 8 is deposited and thereafter p-SiO (silicon oxide film formed by the plasma enhanced CVD process) 9 is deposited.

Next, as shown in FIG. 28, wiring pattern 10 is formed in the p-SiO 9 by resist patterning and dry etching. On the occasion of the dry etching the p-SiN 8 is used as an etching stopper, whereby the wiring pattern 10 can be formed on a stable basis. Then contact pattern 11 is formed by resist patterning and dry etching.

Subsequently, as shown in FIG. 29, wiring material 12 is deposited. A method for depositing the wiring material 12 herein may be selected from a variety of methods, among which a sputter reflow method of Al- or Cu-based metal material is effective in terms of production cost, reliability, and enhancement of characteristics of device. An effective way to enhance the reliability and reflow characteristics is to form a layer of barrier metal such as Ti/TiN as a ground layer, prior to the above deposition by sputter reflow.

Next, as shown in FIG. 30, the CMP for metal is carried out to polish and flatten the wiring material 12, thereby forming buried wiring 13. The above described the method for forming the buried wiring by dual damascene. By the like method wiring 13' of the second layer and wiring 13" of the third layer can be formed as shown in FIG. 31 and FIG. 32, thereby obtaining the further multilayered structure of wiring.

As described above, the polishing by CMP is effective as means for planarization, but also has some points to be improved. One of them is the problem of washing after the CMP. Since the CMP step itself is a polishing step for machining the wafer surface with the abrasive in the form of a slurry, abrasive particles of the slurry and chips and products produced in the polishing step are adhering to the wafer surface after the CMP. These must be removed by washing. Since the wiring material is the Al- or Cu-based metal material, chemical washing with an acid or an alkali would pose the problem of corrosion thereof and is thus hardly applicable. Sufficient cleanliness is not achieved by only washing with pure water. As for scrubbing washing, which is physical washing using pure water, and a PVA sponge or a mohair brush, because the wiring material is the soft metal material, dust particles adhering to the wafer surface would be the cause of production of fine flaws called scratches on the surface of wiring material, which would pose the problem in reliability, such as electromigration.

In addition to the above methods, a washing method, for example, using field-ionized water with a low metal etching property has also keen proposed (H. Aoki, et al., 1994 VLSI Technical Dig., p 79 (1994)), but as presently employed the abrasive particles adhering to the wafer surface cannot be sufficiently removed by this method.

SUMMARY OF THE INVENTION

An object of the present invention is to provide a fabrication method of semiconductor device comprising, after formation of an electroconductive material film, a step capable of stably washing a surface of the electroconductive material film at high cleanliness without corrosion thereof and without production of scratch.

Another object of the present invention is to provide a fabrication method of semiconductor device comprising a step of forming an electroconductive material film on a substrate, a step of polishing the electroconductive material film, and a step of washing a polished surface of said electroconductive material film, wherein said washing step is a step of carrying out ultrasonic washing with a washing solution to which an ultrasonic wave is applied, prior to physical washing.

According to the present invention, the polished surface of the electroconductive material film is washed using the washing solution to which the ultrasonic wave is applied, prior to the physical washing, whereby chips made by polishing and abrasive particles of slurry can be effectively removed. By this method, the electroconductive material film for forming the wiring, electrodes, etc, can be washed without production of scratch, or with very little production thereof, and with high cleanliness. The fabrication method of semiconductor device according to the present invention as described can provide a semiconductor device having the electroconductive material member with the extremely flat surface, without a scratch, and with excellent reliability.

BRIEF DESCRIPTION OF THE DRAWINGS

FIG. 10 is an optical microscope photograph of a scratch on Al surface;

DETAILED DESCRIPTION OF THE PREFERRED EMBODIMENTS

Figure 1:
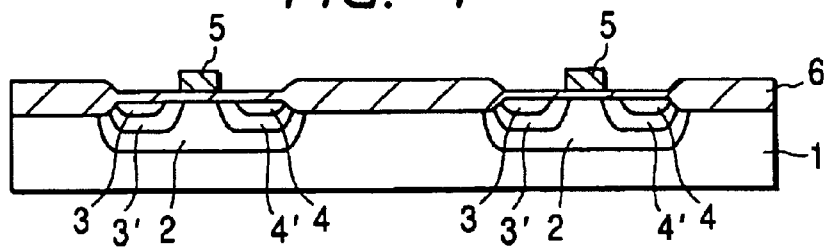
FIG. 1 is an explanatory drawing of the first embodiment of the fabrication method of semiconductor device according to the present invention.

A fabrication method of semiconductor device according to the present invention is a fabrication method of semiconductor device comprising a step of forming an electroconductive material film on a substrate, a step of polishing the electroconductive material film, and a step of washing a polished surface of said electroconductive material film, wherein said washing step is a step of carrying out ultrasonic washing with a washing solution to which an ultrasonic wave is applied, prior to physical washing.

In the present invention the "electroconductive material" means any material generally used as a wiring material or as an electrode material in the fields of semiconductor industries.

Specific examples of the electroconductive material are Al, Au, Cr, Mo, Pt, Ti, Pt, and polysilicon, used as metal for wiring, metal for barrier, metal for close fit, metal for contact, metal for buffer, or the like, or alloys thereof, ITO (Indium Tin Oxide) used as a transparent electrode, and so on.

A method for film formation of these electroconductive materials is selected from sputtering, vacuum vapor deposition, CVD (Chemical Vapor Deposition), and so on, and the method is not limited to these.

The polishing method of the electroconductive material film can be suitably selected depending upon characteristics and applications of the film, but a preferably applicable method is the chemical mechanical polishing (CMP).

An example of the chemical mechanical polishing (CMP) applicable herein is a method for removing reaction products produced by chemical reaction between the chemical component contained in the abrasive and the polished sample surface, by mechanical polishing with the abrasive and the abrasive cloth. The process of CMP involves a step of mounting the sample to be polished on a rotatable polishing head and a step of thereafter carrying out polishing as pressing the surface of the polished sample against a rotating platen (abrasive plate). A pad (abrasive cloth) is bonded to the surface of platen and polishing takes place by the slurry (abrasive) attached to this pad.

Examples of the abrasive cloth preferably applicable are Supreme RN available from Rodel Inc. and a continuous foam suede type cloth such as Surfin IV-1 available from Fujimi Corporation. Examples of the slurry preferably applicable are colloidal-silica-based slurries with high dispersivity whose primary and secondary particle sizes of abrasive particles are not more than 100 nm, such as PLANERLITE-5102 available from Fujimi Corporation or alumina-based slurries such as XJFW-8099 available from Rodel Inc., and so on.

The ultrasonic washing preferably applicable in the present invention is that for rotating an object for washing (washing object) at 1000–2500 rpm and discharging pure water to which the ultrasonic wave is applied, from a swinging nozzle to the washing object to wash the washing object. The frequency of the ultrasonic wave applied is preferably not less than 800 kHz, taking damage of the washing object into consideration, and most preferably, it is selected from frequencies of 1 MHz to 3 MHz both inclusive.

In the present invention, the "physical washing" means general physical washing used in contradistinction with the chemical washing. Specific examples of the physical washing include brush scrubbing, high-pressure jet washing, and so on. The brush scrubbing is normally carried out as follows. The washing object is rotated, a washing solution (pure water, a surfactant, or the like) is supplied to the washing object, and at the same time as it, a rotating brush is moved on the washing object, thereby physically removing deposited particles on the washing object. Typical examples of materials for the brush are mohair, sponge, nylon, goat hair, and so on. Among these, the mohair brush and sponge brush (for example, PVA (polyvinyl alcohol) sponge brush) are preferably applicable. The high-pressure jet washing method is a washing method for ejecting pure water pressurized to approximately 50 to 100 kgf/cm$^2$ by a pump, through a nozzle tip onto the surface of the washing object. This washing method is also the washing carried out while rotating the washing object and swinging the jet nozzle.

A multilayer interconnection process of semiconductor device and a fabrication process of reflection type liquid-crystal display device will be described as typical embodiments of the present invention. Although the following description of the processes is given by use of a semiconductor substrate, the substrate is not always limited to the semiconductor substrate. For example, the substrate may be an SOI (Silicon On Insulator) substrate or a transparent substrate.

The multilayer interconnection process can be applied to fabrication processes of memory elements such as DRAM and logic elements such as MPU or ASIC.

In the following description, all switching elements of an active matrix substrate forming the liquid-crystal display device are of the MOSFET type, but they may be of the diode type, the bipolar transistor type, or the TFT type.

The reflection type liquid-crystal display device is effectively used as a display device such as a home-use television, a projector, a head-mounted display, a video conference system, or a panel of airplane.

[First Embodiment]

FIG. 1 to FIG. 7 are explanatory drawings of the multilayer interconnection fabrication process of semiconductor device according to the present invention. In FIG. 1, reference numeral 1 designates a p-type semiconductor substrate, 2 n-type wells, 3 high-concentration p$^+$-type source electrodes, 4 high-concentration p$^+$-type drain electrodes, and 5 gate electrodes. Low-concentration p$^-$-type electric field relaxing regions 3', 4' for increasing the withstand voltage of transistor are provided around the source electrodes 3 and drain electrodes 4. Incidentally, offset amounts of the electric field relaxing regions 3', 4' are preferably 0.5 to 2.0 $\mu$m. Numeral 6 denotes selective oxide regions for element isolation.

Figure 2:
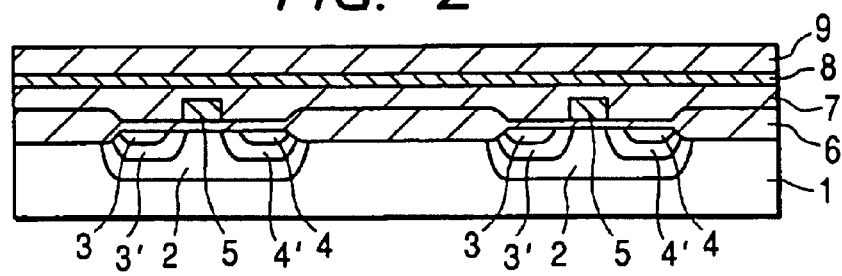
FIG. 2 is an explanatory drawing of the first embodiment of the fabrication method of semiconductor device according to the present invention.

Then, as shown in FIG. 2, NSG (non-doped glass) 7 was deposited by CVD or TEOS and thereafter this NSG 7 was polished and flattened by CMP. The CMP of NSG 7 herein was carried out preferably using an abrasive cloth, which was a lamination of a foam cloth such as IC-1000 (available from Rodel Inc.) normally used for CMP of layer insulation film and a cloth of nonwoven fabric type, and a silica-based slurry such as SC-1 (available from Cabot Inc.) using fumed silica or colloidal silica. Then p-SiN (silicon nitride film formed by the plasma CVD) 8 was deposited and subsequently, p-SiO (silicon oxide film formed by the plasma CVD) 9 was deposited. Since the p-SiN 8 is used as an etching stopper upon patterning of p-SiO 9, the thickness of the p-SiN 8 is determined to be not less than 500 Å. Since the thickness of p-SiO 9 determines the thickness of Al wiring, the thickness of p-SiO 9 needs to be equal to or greater than the thickness of necessary Al wiring for device.

Figure 3:
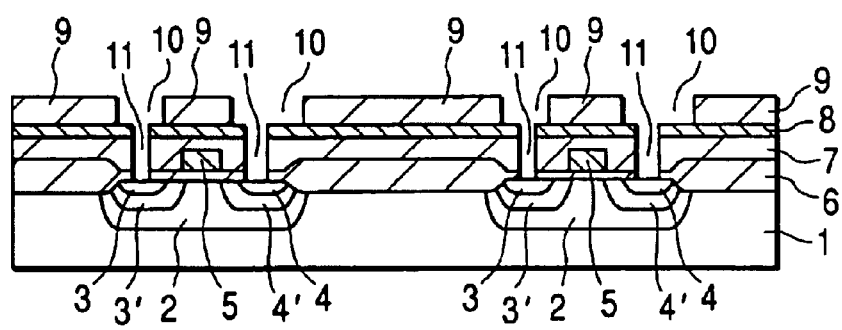
FIG. 3 is an explanatory drawing of the first embodiment of the fabrication method of semiconductor device according to the present invention.

Then, as shown in FIG. 3, the p-SiO 9 was patterned in wiring pattern 10 of Al by resist patterning and dry etching. Conditions of the dry etching employed herein were as follows: flow rates of etching gases $CF_4/CHF_3$=50 ccm/10 ccm; the total pressure 1000 mTorr; the power 750 W. The etch selectivity to the p-SiN 8 at this time was p-SiO etch rate/p-SiN etch rate=2.2. Subsequently, the contact pattern 11 was made by resist patterning and dry etching. Here, the interlayer film to be etched in etching of contact was the lamination of different films of p-SiN 8 and NSG 7, and thus the dry etching was two-step etching. The first-step etching conditions for etching the p-SiN 8 were $CF_4/CHF_3$=100 ccm/20 ccm, the total pressure 1700 mTorr, and the power 750 W; the second-step etching conditions for etching the NSG 7 and gate oxide film were $CF_4/CHF_3$=50 ccm/10 ccm, the total pressure 1000 mTorr, and the power 750 W.

Figure 4:
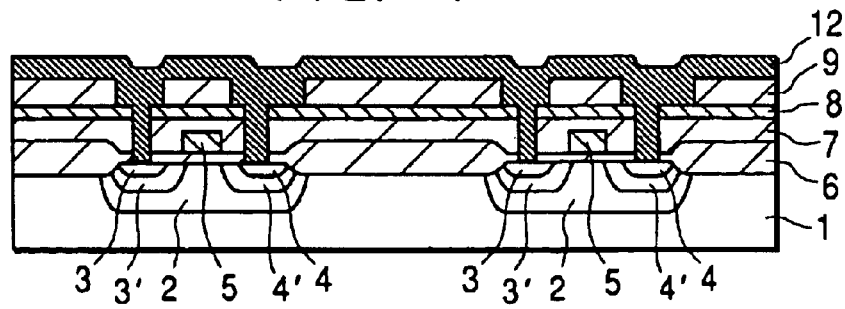
FIG. 4 is an explanatory drawing of the first embodiment of the fabrication method of semiconductor device according to the present invention.
Figure 5:
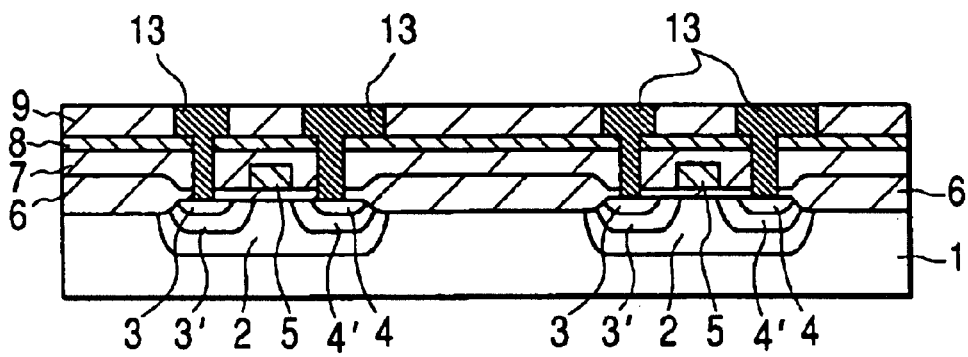
FIG. 5 is an explanatory drawing of the first embodiment of the fabrication method of semiconductor device according to the present invention.

Then wiring material 12 was deposited as shown in FIG. 4. In general, the wiring material 12 is one of metal materials such as AlSi, AlCu, or AlSiCu. When burying of contact holes 11 is conducted using the sputter reflow technology as a deposition method of those materials, the reliability of device is effectively enhanced. If a barrier metal of Ti/TiN is provided as a ground layer prior to the sputter reflow, the contact resistance will be decreased and reflow characteristics of the wiring material of AlSi or the like will be enhanced, thus facilitating the burying of contact holes 11. Another effective method for burying the contact holes 11 is a method using selective CVD of tungsten. Then the wiring material 12 was polished and flattened by metal CMP, and the wiring material was left only in the wiring pattern 10 and contact holes 11, thus forming buried wiring 13 (FIG. 5). In this case, polishing was carried out using the abrasive cloth of Surfin IV-1 available from Fujimi Corporation, the slurry of PLANERLITE-5102 available from Fujimi Corporation, and the CMP apparatus EPO-114 avaialble from Ebara Corp. Specific polishing conditions were as follows: the load of the top ring 300 gf (gram-force)/cm$^2$; the number of revolutions of the carrier 49 rpm; the number of revolutions of the polishing plate 50 rpm; the back side pressure 100 gf/cm$^2$; dressing was in-situ dressing (which is dressing for simultaneously carrying out polishing and dressing) under the number of revolutions of nylon brush 51 rpm and the load thereof 42 gf/cm$^2$; the slurry flow rate 100 ml/min. When AlSi the Si content of which was 1 wt % was polished under the above conditions, the polishing rate 3000 Å/min and in-plane uniformity σ/polishing rate≦5% were achieved without generation of scratch in the polishing step.

Figure 8:
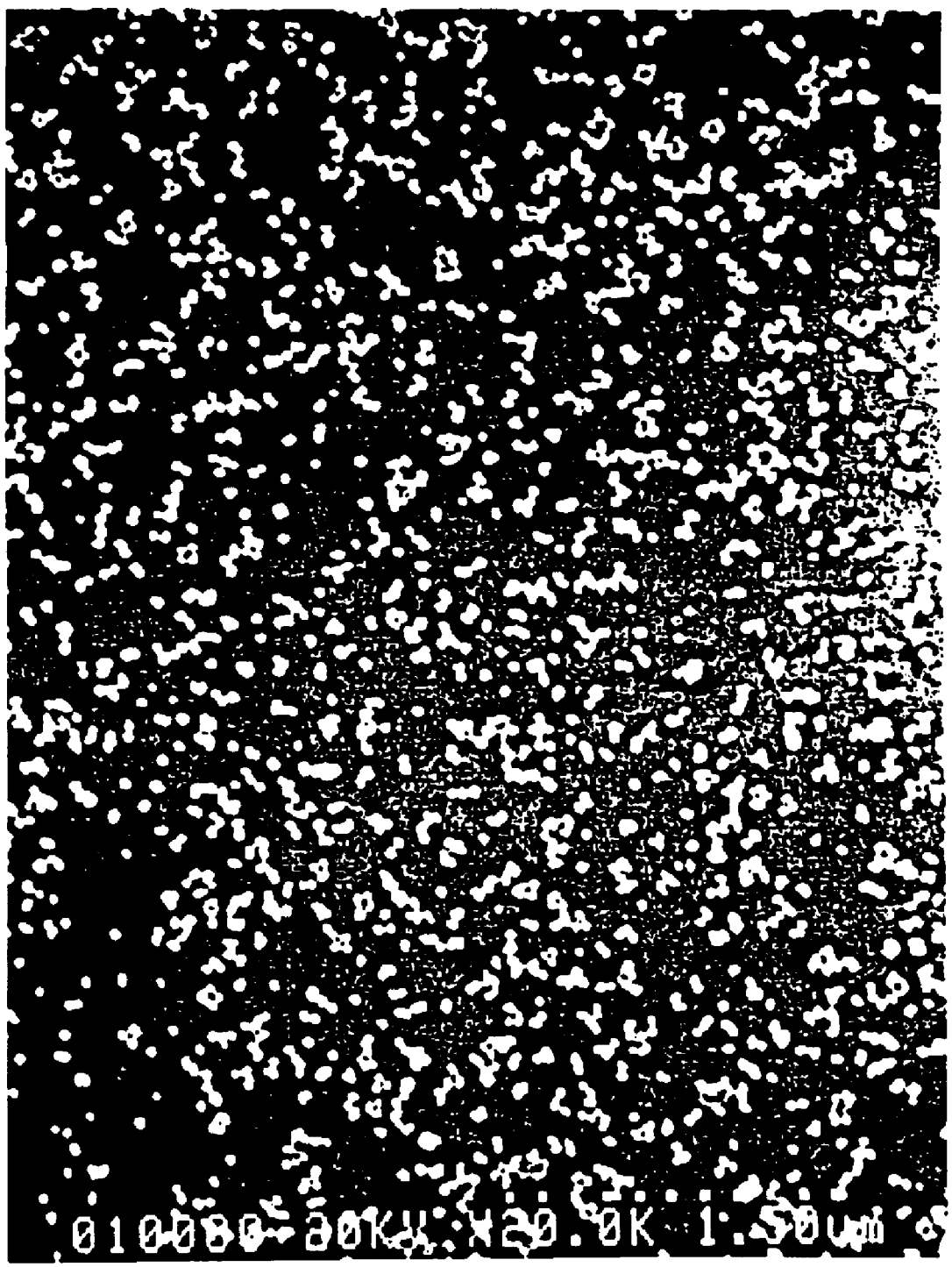
FIG. 8 is an SEM photograph of Al surface after metal CMP.
Figure 9:
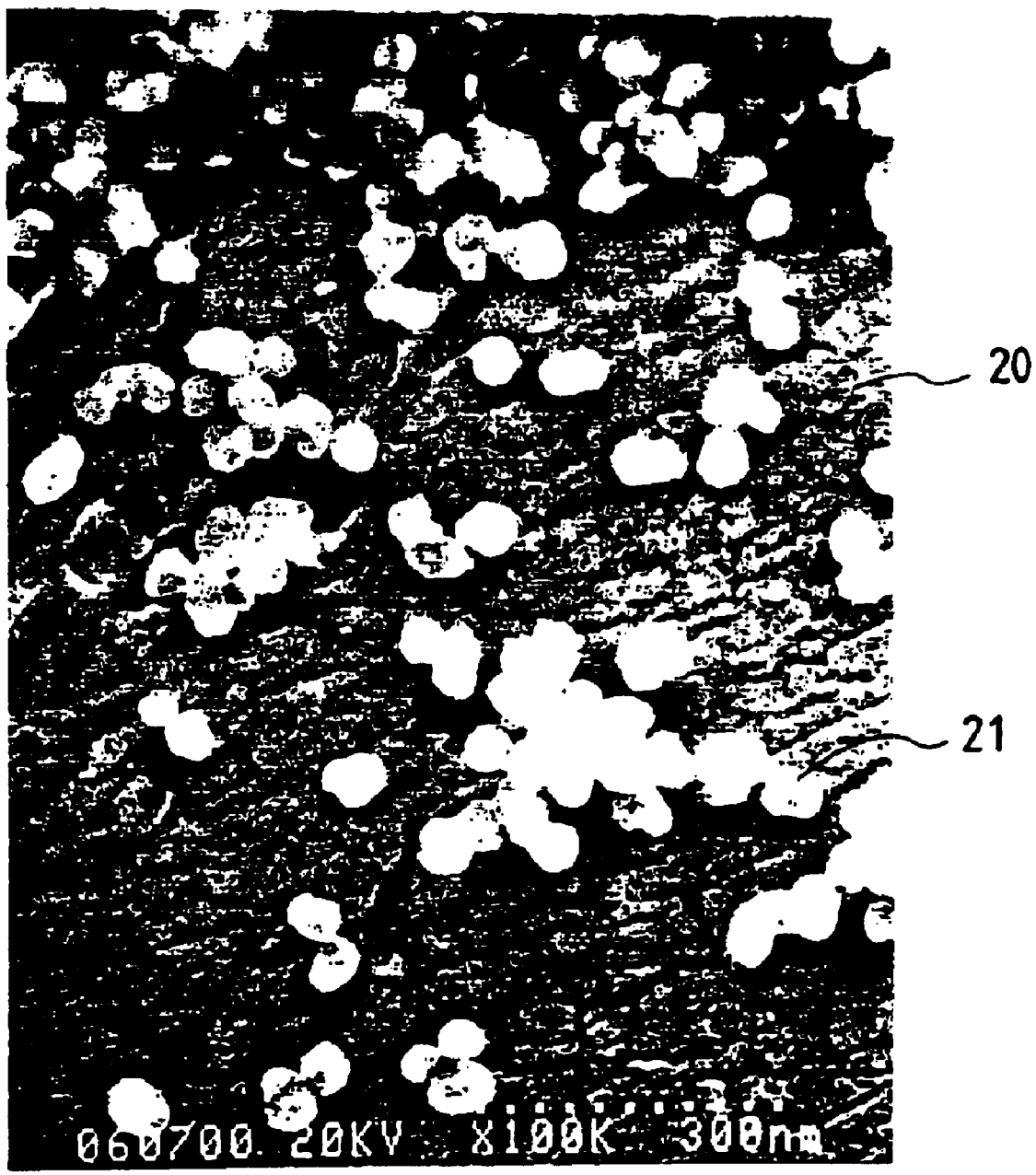
FIG. 9 is an enlarged photograph of FIG. 8.

FIG. 8 shows an SEM photograph of the Al surface immediately after the metal CMP. FIG. 9 is an enlarged SEM photograph of FIG. 8. It is apparent that a lot of abrasive particles 21 remain on the Al surface 20. The average density of unremovable particles 21 on the Al surface 20 was approximately 200 particles/$\mu$m$^2$. In addition to the unremovable particles 21, there remained several thousand dust particles of 0.3 $\mu$m and more on the 6-inch wafer. Thus, such abrasive particles and dust particles have to be removed without generation of scratch by the washing step after the metal CMP.

When the scrubbing washing with the PVA brush often used in general was applied to the washing of the Al surface after the metal CMP, there appeared many scratches 22 shown in the optical microscope photograph of FIG. 10. Relatively large particles or aggregate particles that existed on the Al surface before the washing are considered to be the cause of the scratches. It is thus necessary to wash the dust particles or abrasive particles, which could be the cause of scratch, away by a physical non-contact technique before the brush scrubbing washing for physically scraping the surface.

Figure 11:
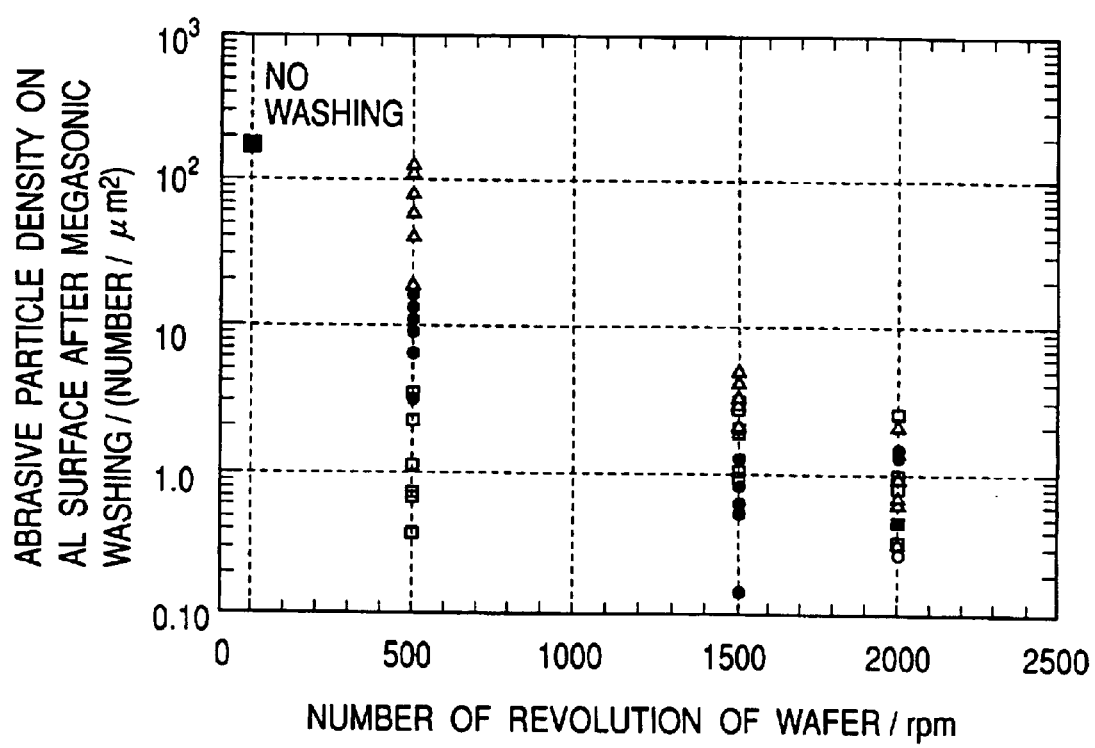
FIG. 11 is a drawing to show experimental results of wafer-rpm dependence of the megasonic washing effect.
Figure 33:
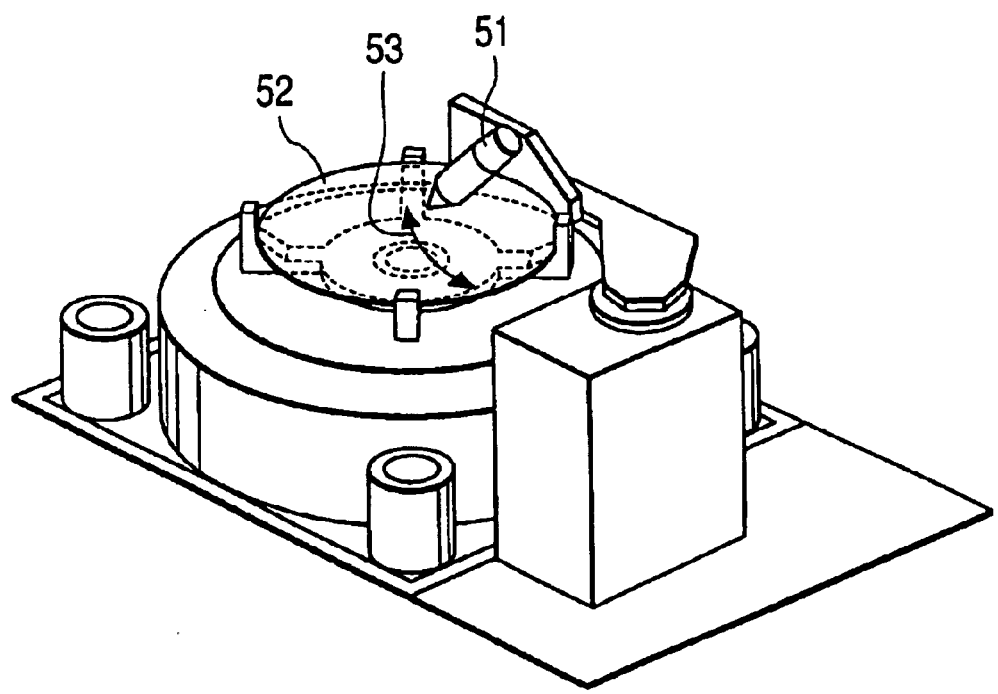
FIG. 33 is an explanatory drawing to show the configuration of a washing apparatus.

The inventor used the megasonic washing for washing the surface of wafer with a flow of pure water loaded with high-frequency vibration. Conditions of megasonic pure water were determined so that the vibration of the frequency 1.5 MHz and the power 48 W was applied from an oscillator provided in a nozzle to the pure water flowing at the rate of 1 l/min through the tip of the nozzle having the diameter 6 mmφ. It was verified that the washing effect of abrasive particles on the Al surface by the megasonic washing depended upon the number of revolutions of the wafer upon washing as shown in FIG. 11. Each of 0 mm, 30 mm, and 60 mm described in FIG. 11 indicates a distance from the center of wafer to a measurement point and conditions of the megasonic nozzle are the scan speed: 10 mm/sec and the number of scans: 20. As seen from FIG. 11, the number of revolutions of wafer upon the megasonic washing is preferably not less than 1500 rpm and more preferably not less than 2000 rpm. FIG. 33 is an explanatory drawing to show the configuration of a washing device. As shown in FIG. 33, the nozzle 51 for discharging the washing solution is movable above the wafer 52. Arrows 53 indicate moving directions of the nozzle.

Figure 15:
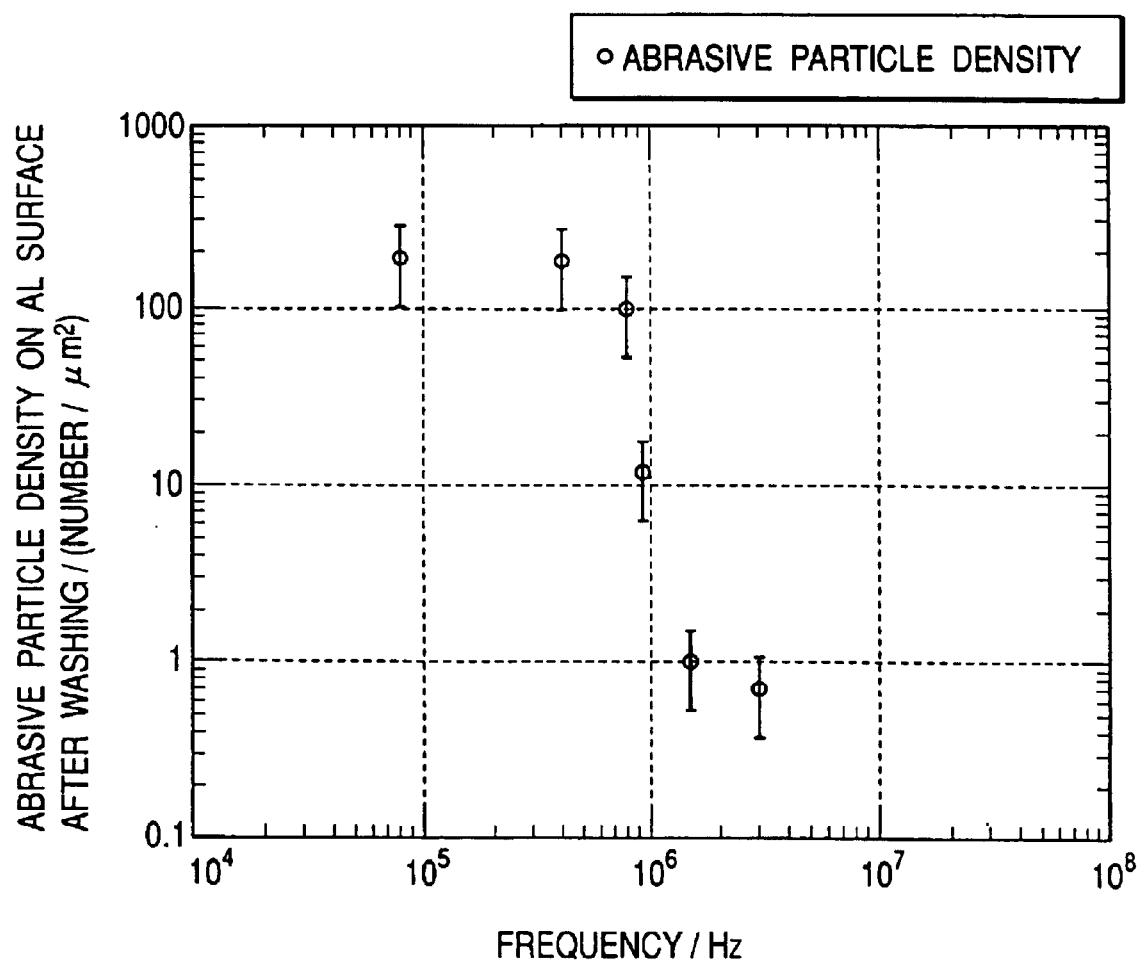
FIG. 15 is a graph to show frequency dependence of washing power of a washing solution to which the ultrasonic wave is applied.

Next examined was washing water vibration frequency dependence of the washing effect of abrasive particles on the Al surface. The results are shown in FIG. 15. In this examination, measurements were conducted under such conditions that the number of revolutions of wafer upon washing was 2000 rpm, the scan speed of the washing water nozzle was 10 mm/sec, the number of scans of the nozzle was 20, and frequencies were varied. It is understood from the drawing that the removing effect of particles adhering to the Al surface starts appearing when the frequency of vibration loaded on the washing water becomes 800 kHz and that the extremely great washing effect appears in the region of frequencies of the MHz order.

In general, the washing using low frequencies ranging from several ten kHz to approximately 400 kHz is a washing method for removing the dust particles of sizes from several $\mu$m to several ten $\mu$m on the surface of substrate by applying strong shock waves to the surface of substrate through liquid cavitation resulting from liquid resonance. This washing method has the problem that the shock by this liquid cavitation could damage micropatterns. Therefore, it is not used in semiconductor processes of 4M-DRAM and after. In the examination by the inventor, the problem of exfoliation of patterned Al arose in the washing at 80 kHz and 400 kHz. On the other hand, no damage of pattern was recognized at high frequencies of not less than 800 kHz.

Taking the above washing effect and pattern damage into consideration, use of high frequencies of not less than 800 kHz is effective for washing of abrasive particles adhering to the Al surface. It is understood that the frequency is determined more preferably in the range of 1 MHz to 3 MHz both inclusive.

Figure 12:
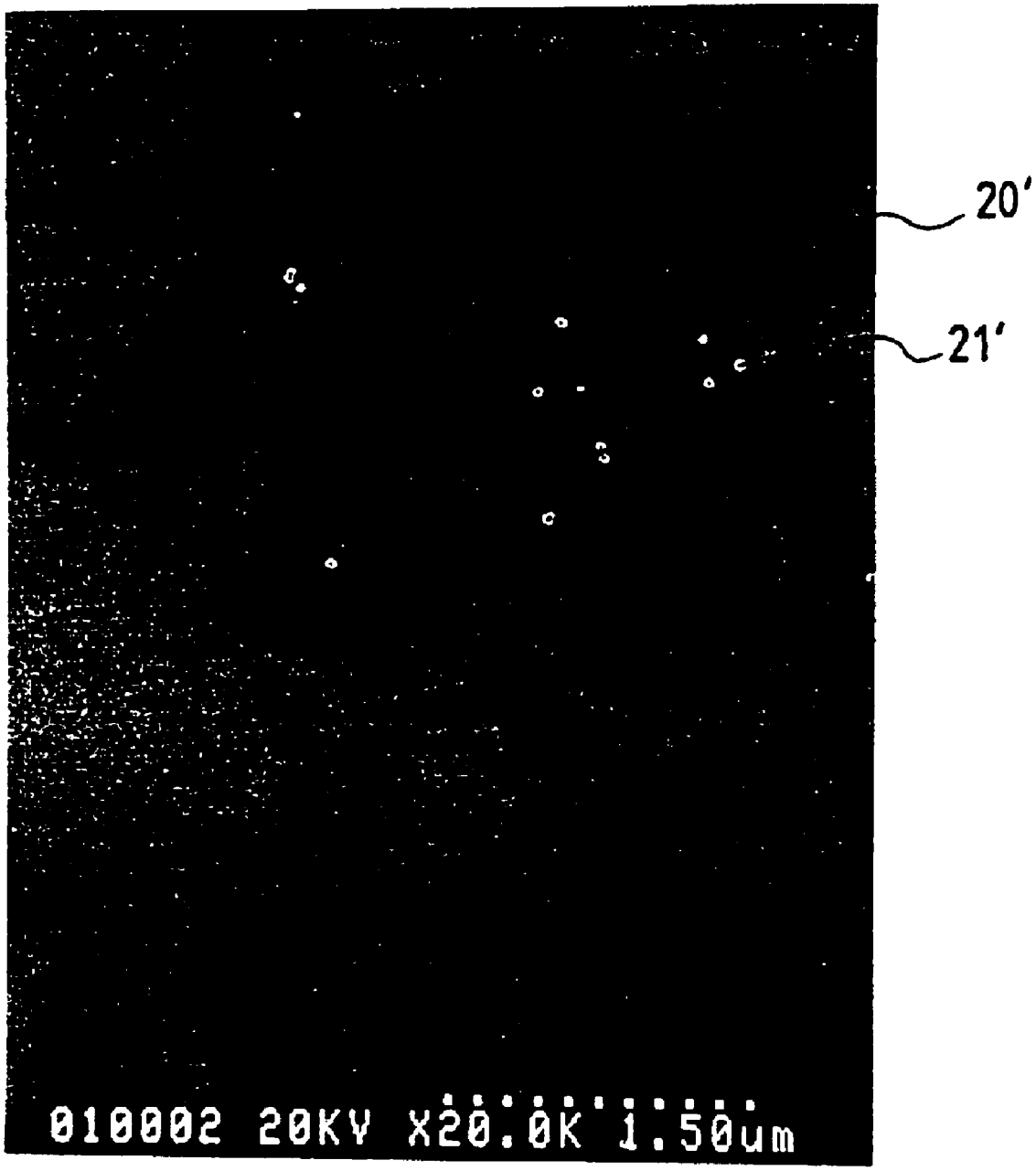
FIG. 12 is an SEM photograph of Al surface after megasonic washing.
Figure 13:
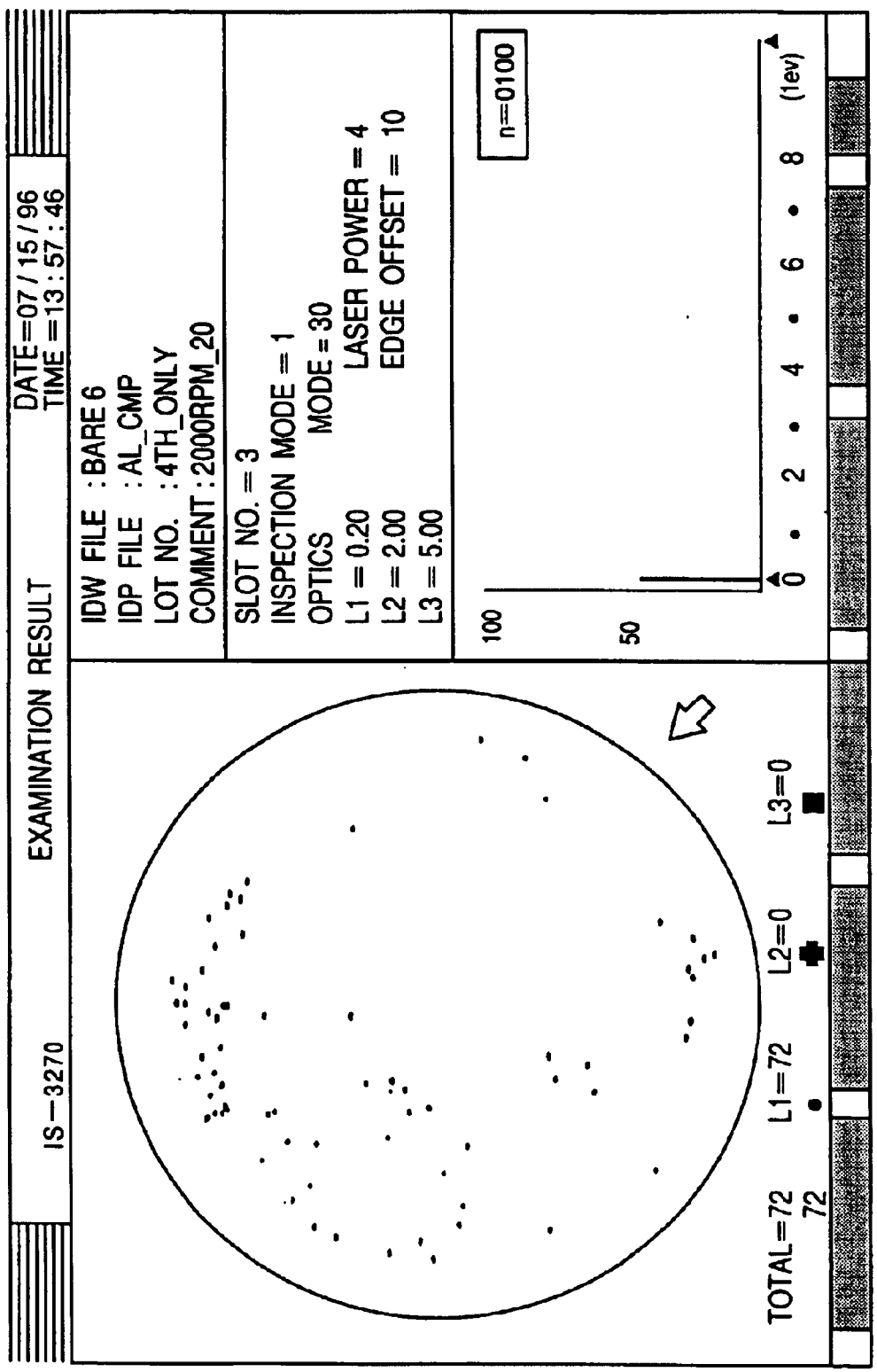
FIG. 13 shows measurement results of dust particles of 0.3 μm and more after megasonic washing.

Next, the Al surface was washed under such conditions that the frequency was 1.5 MHz, the number of revolutions of the wafer was 2000 rpm, the scan speed of the nozzle was 10 mm/sec, and the number of scans of the nozzle was 20. As a result, the particles on the Al surface were removed down to the density of 30 particles/$\mu$m$^2$ or less. FIG. 12 shows an SEM photograph of the Al surface washed under the above conditions. The distance from the center of wafer to the measurement point in FIG. 12 is 30 mm. In the photograph numeral 20' denotes the Al surface and 21' abrasive particles. The dust particles of 0.3 $\mu$m and greater were able to be removed to approximately several ten particles on the 6-inch wafer. FIG. 13 shows the results of measurement of particles of 0.3 $\mu$m and greater by particle examining apparatus IS-3270 available from Hitachi, Ltd. During the above megasonic washing the back face of wafer was always kept in a wet state with shower of pure water.

Figure 14:
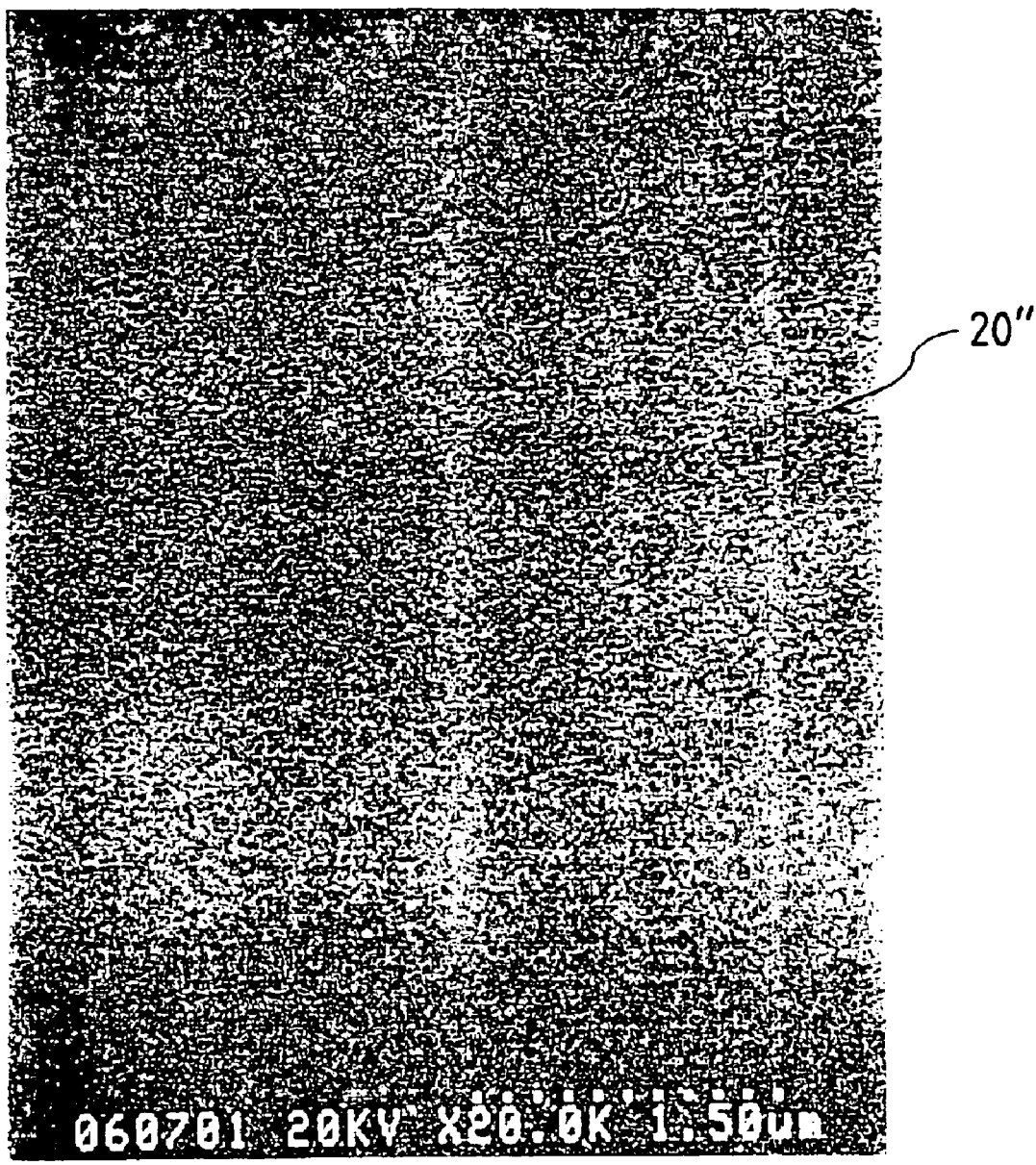
FIG. 14 is an SEM photograph of Al surface after washing according to the first embodiment.

Then simultaneous brush scrubbing washing was conducted to clean the Al surface after the megasonic washing with a pencil type PVA sponge and to clean the back face of wafer with a roll type PVA sponge. The washing conditions were as follows. For the Al surface, a pressing amount of the pencil type PVA sponge was 1 mm, the number of revolutions of the sponge was 60 rpm, the number of revolutions of the wafer was 100 rpm, the scan speed of the pencil type PVA sponge was 10 mm/sec, and the number of scans was 3. For the back face of wafer, a pressing amount of the roll type PVA sponge was 1 mm, the number of revolutions of the roll sponge was 100 rpm, and the washing time was 60 seconds. Further, the megasonic washing was again carried out after the scrubbing washing. The washing conditions were exactly the same as the aforementioned megasonic washing conditions except that the number of scans of the nozzle was 3. After that, the wafer was dried by spin drying at the number of revolutions of wafer of 2300 rpm for 30 seconds. FIG. 14 shows an SEM photograph of the Al surface having resulted after the above washing operations. In the photograph numeral 20" indicates the Al surface. It is seen that the abrasive particles and dust particles are removed clean.

Figure 6:
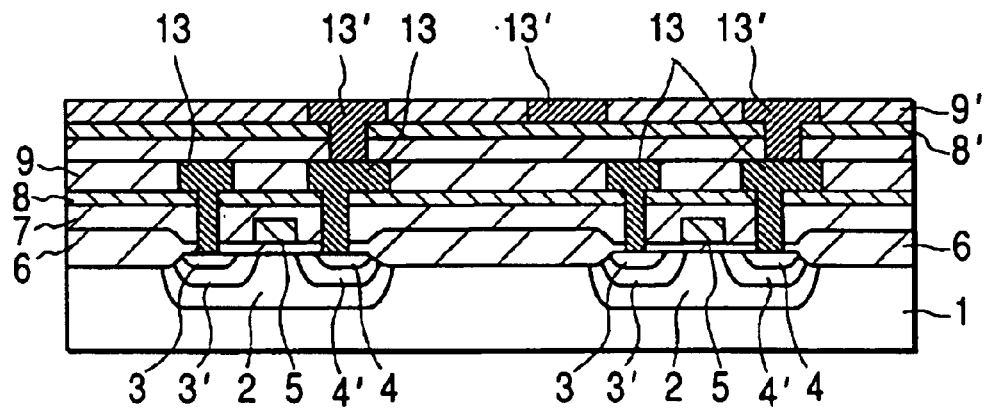
FIG. 6 is an explanatory drawing of the first embodiment of the fabrication method of semiconductor device according to the present invention.
Figure 7:
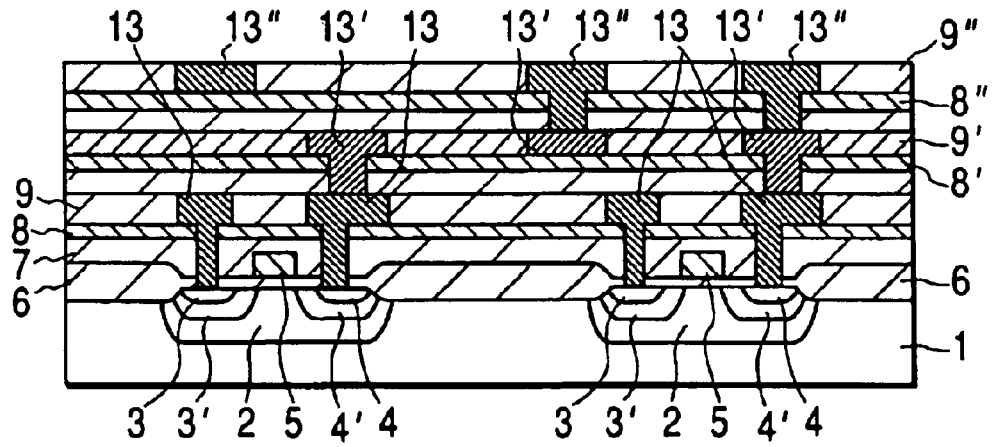
FIG. 7 is an explanatory drawing of the first embodiment of the fabrication method of semiconductor device according to the present invention.

Next, as shown in FIG. 6, a lamination of second layer p-SiN 8' and second layer p-SiO 9' were successively deposited and thereafter second layer buried wiring 13' was formed by the same method as the dual damascene as described referring to FIG. 3 to FIG. 5. Then buried wiring 13" of third layer was formed by the same technique, as shown in FIG. 7. In the drawing numeral 8" denotes third layer p-SiN and 9" third layer p-SiO. It is needless to mention that buried wiring of the fourth layer and after can be further formed by the like dual damascene. The material for the buried wiring of each layer can also be selected from highly electroconductive materials such as Ag, Au, Pt, Cr, or Cu.

In the present embodiment the wafer surface with exposed metal after formation of the buried wiring was subjected to the following washing after the metal CMP of the dual damascene process. After completion of the polishing, the surface was first subjected to the ultrasonic washing, then to the scrubbing washing with the PVA sponge or mohair brush, and further to the megasonic (ultrasonic) washing. Thereafter, the wafer was dried by spin drying. It is, however, noted that the point of the present invention is to carry out the ultrasonic washing prior to the physical washing and that the present invention is by no means limited to the embodiment described herein.

The washing effect of the above scrubbing washing is further enhanced by carrying out a plurality of washing processes in a plurality of different washing units. By employing the above washing sequence, the washing with extremely high cleanliness is achieved without generation of scratch in the surface of wiring material and over the entire surface of wafer, so that highly reliable semiconductor devices can be provided at high yield.

[Second Embodiment]

An example of application wherein the present invention is applied to a fabrication process of the active matrix substrate of reflection type liquid-crystal display device will be described referring to FIG. 16 to FIG. 25.

Figure 16:
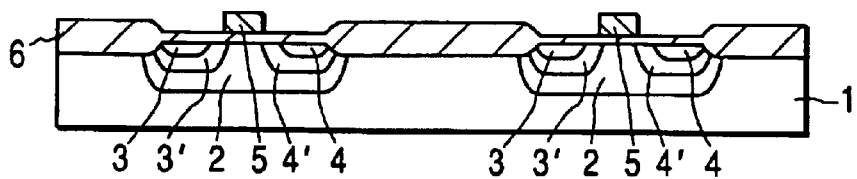
FIG. 16 is an explanatory drawing of a fabrication method of reflection type liquid-crystal display device according to the present invention.

In FIG. 16, numeral 1 designates a p-type semiconductor substrate, 2 n-type wells, 3 high-concentration $p^+$-type source electrodes, 4 high-concentration $p^+$-type drain electrodes, and 5 gate electrodes. Low-concentration $p^-$-type electric field relaxing regions 3', 4' for increasing the withstand voltage of transistor are provided around the source electrodes 3 and drain electrodes 4. Incidentally, offset amounts of the electric field relaxing regions 3', 4' are preferably 0.5 to 2.0 µm. Numeral 6 denotes selective oxide regions for element isolation.

Figure 17:
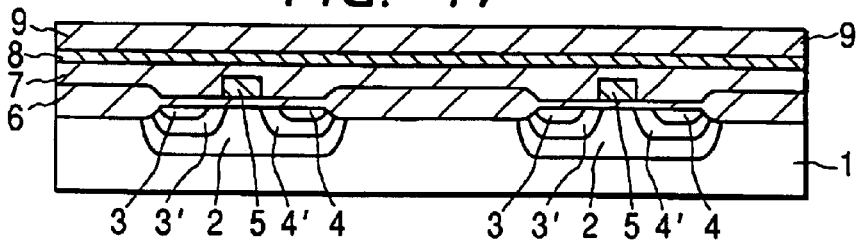
FIG. 17 is an explanatory drawing of the fabrication method of reflection type liquid-crystal display device according to the present invention.

Then, as shown in FIG. 17, NSG (non-doped glass) 7 was deposited by CVD or TEOS and thereafter this NSG 7 was polished and flattened by CMP. The CMP of NSG 7 herein was carried out preferably using the abrasive cloth, which was the lamination of the foam cloth such as IC-1000 normally used for CMP of layer insulation film and the cloth of nonwoven fabric type, and the silica-based slurry such as SC-1 using fumed silica or colloidal silica. Then p-SiN (silicon nitride film formed by the plasma CVD) 8 was deposited and subsequently, p-SiO (silicon oxide film formed by the plasma CVD) 9 was deposited. Since the p-SiN 8 is used as an etching stopper upon patterning of p-SiO 9, the thickness of the p-SiN 8 is not less than 500 Å. Since the thickness of p-SiO 9 determines the thickness of Al wiring, the thickness of p-SiO 9 needs to be equal to or greater than the thickness of necessary Al wiring for device.

Figure 18:
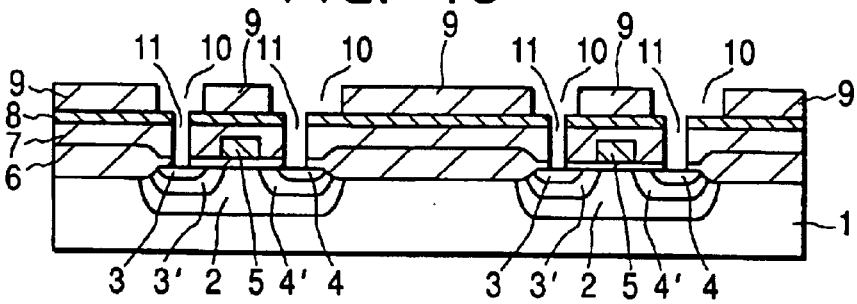
FIG. 18 is an explanatory drawing of the fabrication method of reflection type liquid-crystal display device according to the present invention.

Then, as shown in FIG. 18, the p-SiO 9 was patterned in wiring pattern 10 of Al by resist patterning and dry etching. Conditions of the dry etching employed herein were as follows: flow rates of etching gases $CF_4/CHF_3$=50 ccm/10 ccm; the total pressure 1000 mTorr; the power 750 W. The etch selectivity to the p-SiN 8 at this time was p-SiO etch rate/p-SiN etch rate=2.2. Subsequently, the contact pattern 11 was made by resist patterning and dry etching. Here, the interlayer film to be etched in etching of contact was the lamination of different films of p-SiN 8 and NSG 7, and thus the dry etching was two-step etching. The first-step etching conditions for etching the p-SiN 8 were $CF_4/CHF_3$=100 ccm/20 ccm, the total pressure 1700 mTorr, and the power 750 W; the second-step etching conditions for etching the NSG 7 and gate oxide film were $CF_4/CHF_3$=50 ccm/10 ccm, the total pressure 1000 mTorr, and the power 750 W.

Figure 19:
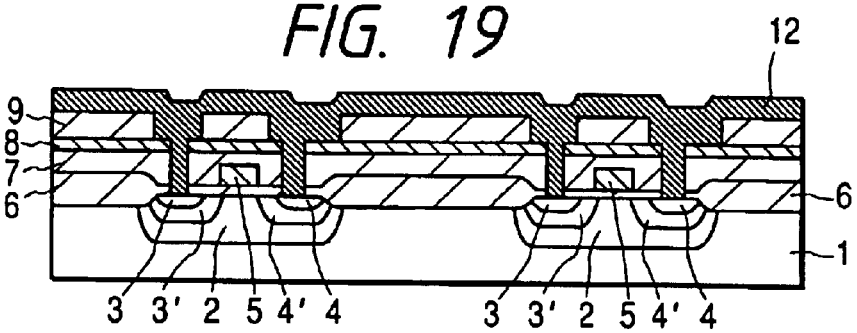
FIG. 19 is an explanatory drawing of the fabrication method of reflection type liquid-crystal display device according to the present invention.

Then wiring material 12 was deposited as shown in FIG. 19.

Figure 20:
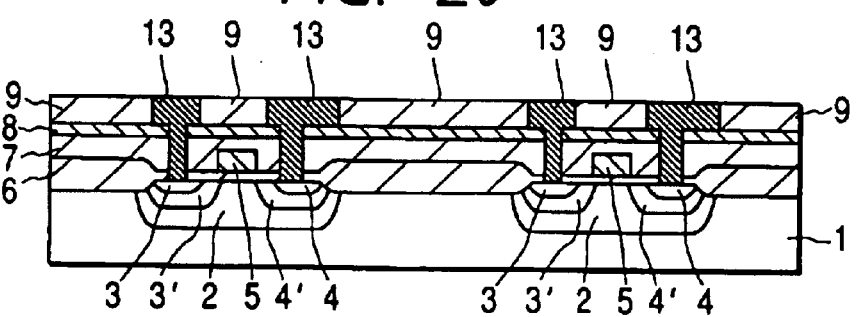
FIG. 20 is an explanatory drawing of the fabrication method of reflection type liquid-crystal display device according to the present invention.

Then the wiring material 12 was polished and flattened by the metal CMP, and the wiring material was left only in the wiring pattern 10 and contact holes 11, thus forming buried wiring 13 (FIG. 20). The method for forming the buried wiring 13 described above is the same as in the first embodiment.

Figure 21:
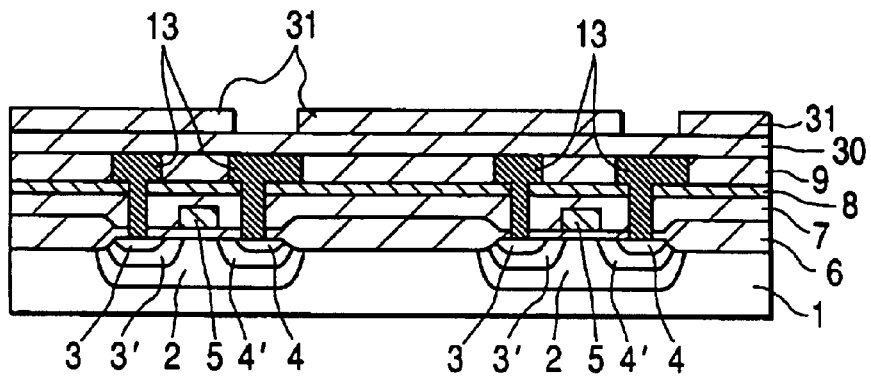
FIG. 21 is an explanatory drawing of the fabrication method of reflection type liquid-crystal display device according to the present invention.

After completion of the polishing by CMP, p-SiO 30 was deposited and then shield layer 31 was deposited as shown in FIG. 21. Materials effectively applicable for the shield layer 31 are metal materials such as Ti, Mo, Al, W, Ag, Pt, or Cr, and in this embodiment Ti was deposited in the thickness of 2000 Å. The shield layer 31 was then patterned.

Figure 22:
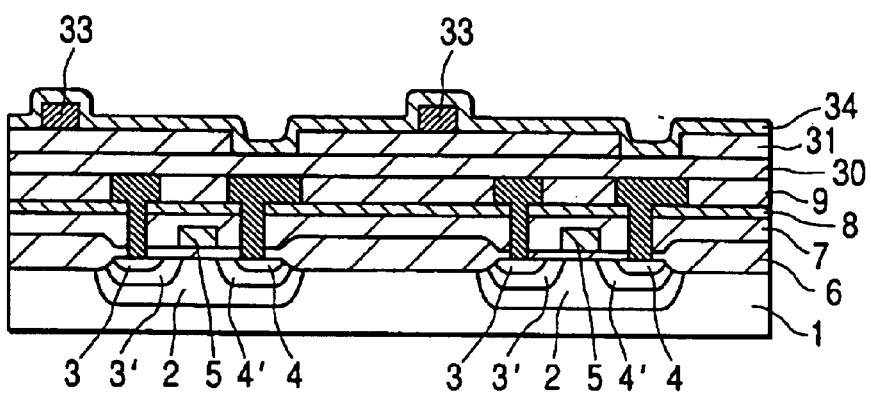
FIG. 22 is an explanatory drawing of the fabrication method of reflection type liquid-crystal display device according to the present invention.

Then, as shown in FIG. 22, p-SiO 33 was deposited in the thickness of 1000 Å or more, and the p-SiO 33 was patterned using the shield layer 31 as an etching stopper. Subsequently, capacitance film 34 was deposited. Materials effectively applicable for the capacitance film 34 are highly dielectric materials such as p-SiN or $Ta_2O_5$, and in this embodiment p-SiN was deposited in the thickness of 4000 Å.

Figure 23:
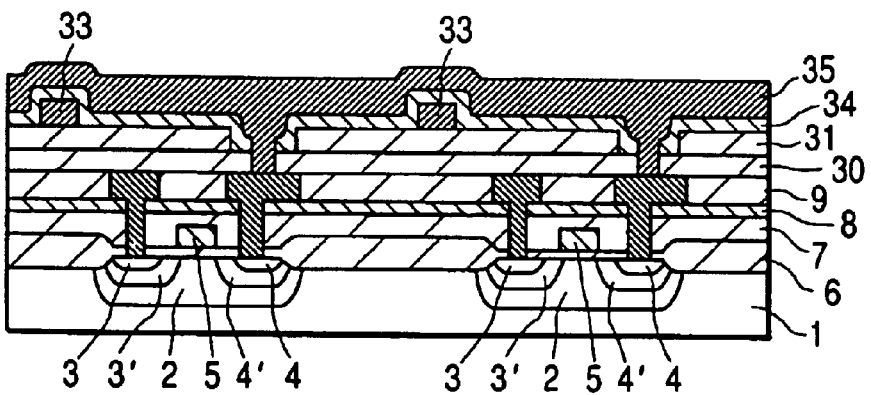
FIG. 23 is an explanatory drawing of the fabrication method of reflection type liquid-crystal display device according to the present invention.

Next, as shown in FIG. 23, the capacitance film 34 and p-SiO 30 were patterned and then reflective electrode material 35 was deposited in the thickness greater than that of p-SiO 33. Materials suitable for the reflective electrode are electroconductive materials with high reflectivity in visible light region, such as Al, Ag, Pt, or Cr. In the present embodiment Al was used.

Figure 24:
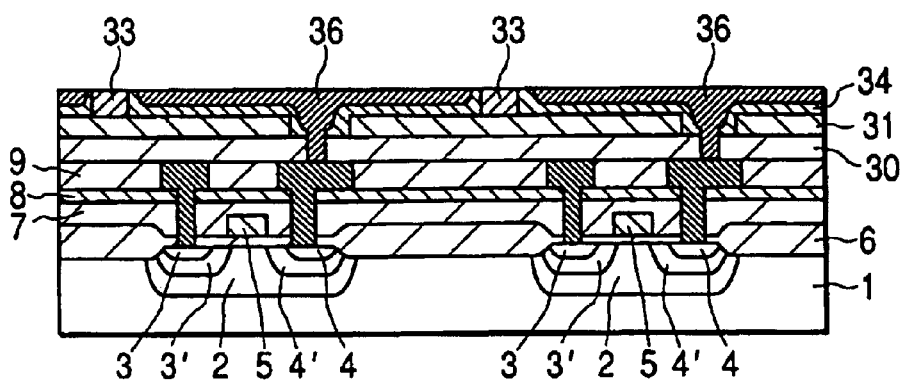
FIG. 24 is an explanatory drawing of the fabrication method of reflection type liquid-crystal display device according to the present invention.

Then, as shown in FIG. 24, the reflective electrode material 35 was polished and flattened by the CMP. A polishing amount was so determined that the surface was polished so as to expose p-SiO 33 in the wafer surface. In this embodiment the reflective electrode 36 was formed by the metal CMP of Al. The conditions upon the aforementioned formation of buried wiring 13 also apply correspondingly to the conditions of the metal CMP of Al and the washing after the polishing.

Figure 25:
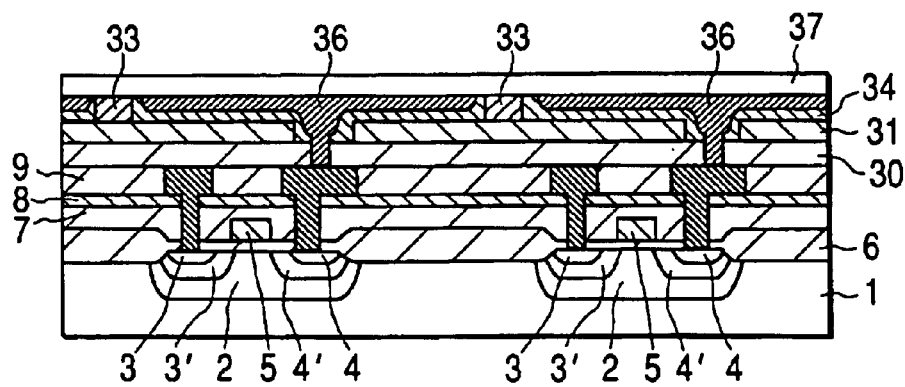
FIG. 25 is an explanatory drawing of the fabrication method of reflection type liquid-crystal display device according to the present invention.
Figure 26:
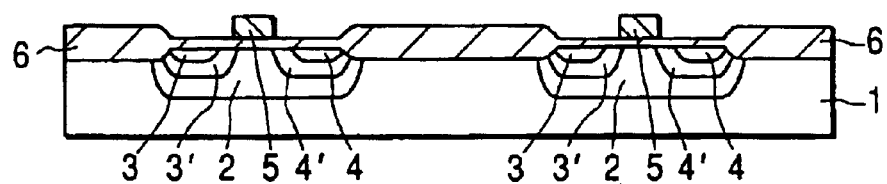
FIG. 26 is an explanatory drawing of the fabrication method of semiconductor device according to the conventional example.
Figure 27:
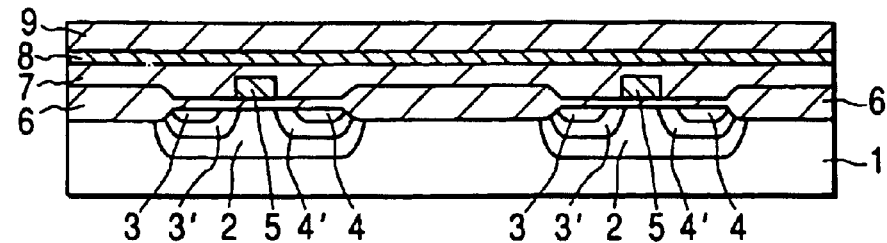
FIG. 27 is an explanatory drawing of the fabrication method of semiconductor device according to the conventional example.
Figure 28:
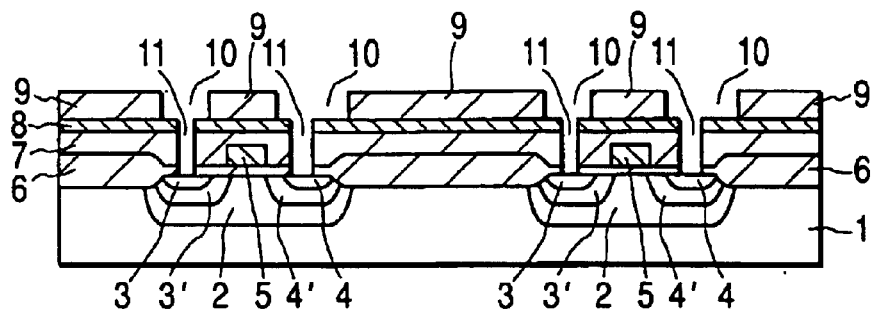
FIG. 28 is an explanatory drawing of the fabrication method of semiconductor device according to the conventional example.
Figure 29:
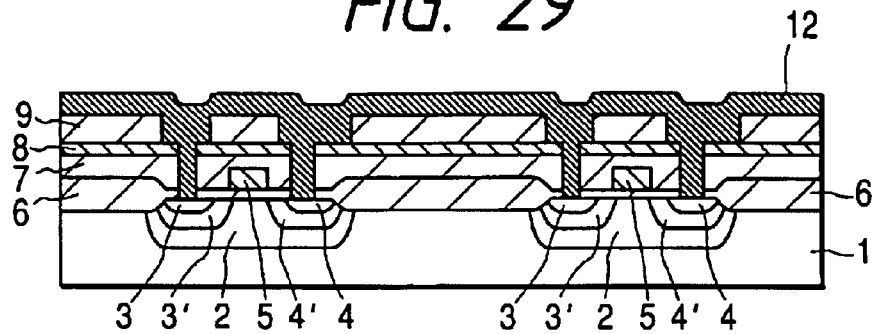
FIG. 29 is an explanatory drawing of the fabrication method of semiconductor device according to the conventional example.
Figure 30:
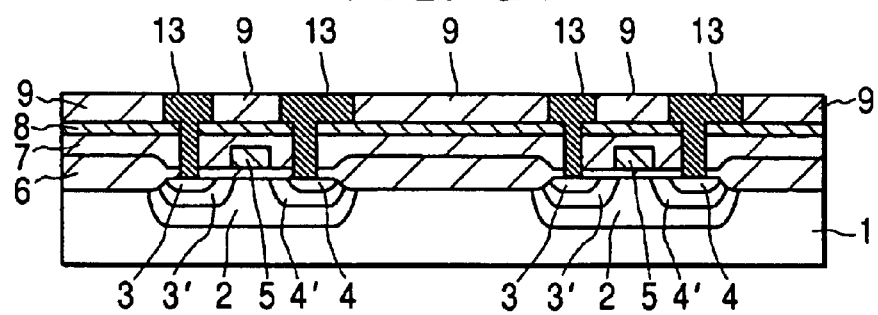
FIG. 30 is an explanatory drawing of the fabrication method of semiconductor device according to the conventional example.
Figure 31:
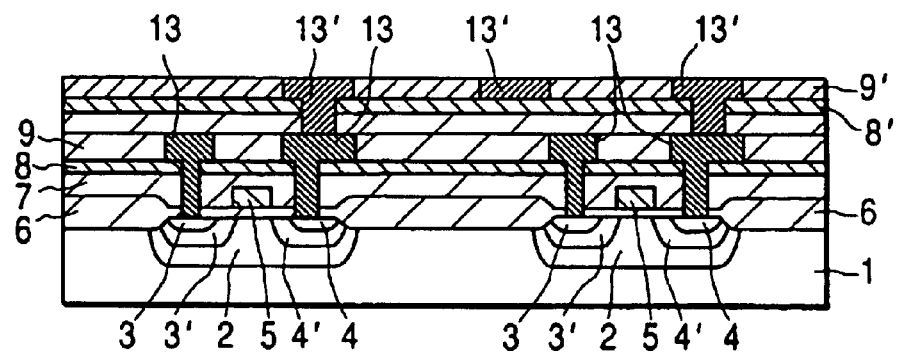
FIG. 31 is an explanatory drawing of the fabrication method of semiconductor device according to the conventional example.
Figure 32:
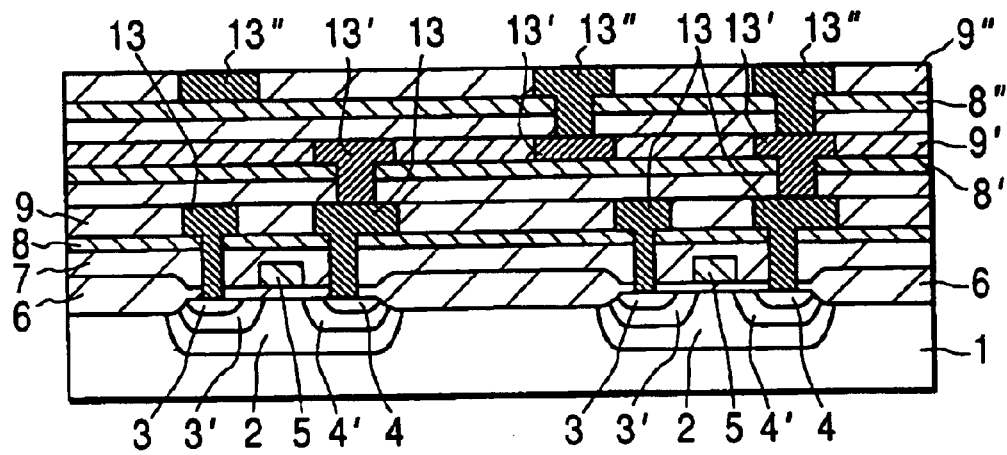
FIG. 32 is an explanatory drawing of the fabrication method of semiconductor device according to the conventional example.

Then reflection enhancing film 37 was deposited as shown in FIG. 25. A material for the reflection enhancing film 37 is selected from dielectrics with high refractive index such as ZnS or $TiO_2$, and the reflection enhancing film 37 is deposited in the thickness equal to a quarter of the wavelength of light used in the display device. A more effective structure is a lamination of layers with increasing refractive indices from the bottom and each in the thickness equal to a quarter of the above wavelength of light, such as p-SiO/p-SiN/TiO$_2$.

The feature of the present embodiment is that in the washing after the metal CMP for formation of the reflective electrode 36 by dual damascene, the wafer surface is first washed by megasonic washing after completion of polishing and subsequently it is washed by physical washing. By employing such washing sequence, the reflective electrode 36 with clean surface is realized without any scratch, and a high-luminance and high-definition reflection type liquid-crystal display device can be provided.

What is claimed is:

1. A fabrication method of a semiconductor device for use in a reflection type display apparatus having a reflective face, the fabrication method comprising the steps:

forming a first insulating film on a substrate on which at least one switching element is formed;

removing a portion of the first insulating film by an etching process to form a first concave section with the first insulating film being removed, the first concave section resulting in a wiring pattern and contact holes;

forming a film of an electroconductive metal material on the first insulating film and in the first concave section with the first insulating film being removed;

polishing the metal material film to remove the metal material formed on the first insulating film;

washing the surface of the substrate including an upper surface of the polished metal material film and an upper surface of the first insulating film which is exposed by the polishing;

forming a second insulating film which covers the metal material formed in the first concave section with the first insulating film being removed;

forming a second concave section with the second insulating film being removed;

forming a film of an electroconductive metal material on the second insulating film and in the second concave section with the second insulating film being removed;

polishing the metal material to remove the metal material formed on the second insulating film, thereby forming the reflective face; and washing the surface of the substrate including the reflective face and an upper surface of the second insulating film which is exposed by the polishing, wherein either of the washing steps comprises the steps of washing the surface of the substrate by means of an ultrasonic wave washing with a washing liquid to which an ultrasonic wave at a frequency band of not less than 800 kHz is applied, and subsequently washing the surface of the substrate by means of a scrubbing washing or a high-pressure jet washing.

* * * * *

UNITED STATES PATENT AND TRADEMARK OFFICE
CERTIFICATE OF CORRECTION

PATENT NO. : 6,743,723 B2
DATED : June 1, 2004
INVENTOR(S) : Yoshihiko Fukumoto

It is certified that error appears in the above-identified patent and that said Letters Patent is hereby corrected as shown below:

Title page,
Item [*] Notice, insert -- This patent issued on a continued prosecution application filed under 37 CFR 1.53(d), and is subject to the twenty year patent term provisions of 35 U.S.C. 154(a)(2). --.

Signed and Sealed this

First Day of February, 2005

JON W. DUDAS
*Director of the United States Patent and Trademark Office*